US006992442B2

(12) United States Patent
Touchberry et al.

(10) Patent No.: US 6,992,442 B2
(45) Date of Patent: Jan. 31, 2006

(54) RESTRICTED GETTER

(75) Inventors: Alan B. Touchberry, Saint Louis Park, MN (US); Gunter Stein, New Brighton, MN (US); Bruce A. Seiber, Arden Hills, MN (US)

(73) Assignee: Honeywell International Inc., Morristown, NJ (US)

( * ) Notice: Subject to any disclaimer, the term of this patent is extended or adjusted under 35 U.S.C. 154(b) by 152 days.

(21) Appl. No.: 10/014,993

(22) Filed: Dec. 11, 2001

(65) Prior Publication Data

US 2003/0107317 A1    Jun. 12, 2003

(51) Int. Cl.
*H01J 17/24* (2006.01)

(52) U.S. Cl. ...................................... 313/549

(58) Field of Classification Search ........ 313/547–549, 313/558–562; 372/94, 87–88, 33; 356/350; 417/48
See application file for complete search history.

(56) References Cited

U.S. PATENT DOCUMENTS

| | | | | |
|---|---|---|---|---|
| 3,876,957 A | * | 4/1975 | Thatcher ....................... 372/59 |
| 4,361,782 A | * | 11/1982 | Reiling ......................... 315/73 |
| 4,503,543 A | * | 3/1985 | Ljung et al. .................. 372/94 |
| 4,670,691 A | * | 6/1987 | Podgorski .................... 313/549 |
| 4,740,985 A | * | 4/1988 | Podgorski ..................... 372/87 |
| 4,865,436 A | * | 9/1989 | Ahonen et al. ............. 359/224 |
| 4,874,339 A | * | 10/1989 | Bratz ........................... 445/28 |
| 4,969,157 A | * | 11/1990 | Malvern ....................... 372/94 |
| 5,056,102 A | * | 10/1991 | Galbrecht .................... 372/87 |
| 5,056,920 A | * | 10/1991 | Ahonen et al. ............. 356/469 |
| 5,091,233 A | * | 2/1992 | Kirby et al. .................. 428/69 |
| 5,127,016 A | * | 6/1992 | Podgorski .................... 372/59 |
| 5,313,488 A | | 5/1994 | Podgorski .................... 372/94 |
| 5,371,591 A | | 12/1994 | Martin et al. |
| 5,386,432 A | | 1/1995 | Ficalora et al. |
| 5,818,591 A | | 10/1998 | Albers et al. ............... 356/350 |
| 5,856,995 A | * | 1/1999 | Morris ......................... 372/87 |
| 5,867,269 A | * | 2/1999 | Albers et al. ............... 356/469 |
| 6,422,824 B1 | | 7/2002 | Lee et al. |
| 2003/0023484 A1 | * | 1/2003 | Patel ............................ 705/14 |
| 2004/0040941 A1 | * | 3/2004 | Ecklund et al. ........ 219/121.63 |

* cited by examiner

*Primary Examiner*—Joseph Williams
*Assistant Examiner*—Dalei Dong
(74) *Attorney, Agent, or Firm*—McDonnell Boehnen Hulbert & Berghoff LLP

(57) ABSTRACT

A getter is a porous sintered metallic alloy used to absorb non-inert gases. The getter is placed in a getter well of a ring laser gyroscope system or other gas discharge system. The getter well is any enclosure in which a getter resides. The getter absorbs oxygen, which may be needed by some gyroscope components to operate. By restricting the gas flow into the getter well or by placing a diffusion barrier on the getter material, the getter may absorb non-inert gas at a slower rate.

8 Claims, 3 Drawing Sheets

RESTRICTED GETTER

FIELD

The present invention relates generally to getters, and more particularly, relates to a method of restricting the rate at which a getter consumes impurities.

BACKGROUND

Getter devices are well known for their ability to absorb impurities. These devices are usually made with a porous sintered metallic alloy, typically consisting of barium, titanium, or zirconium. The porous structure of the getter allows gases to diffuse through pores within the material. Certain types of gas are absorbed to the inner parts of the getter body. Non-inert gases absorb to the inside of the getter, while inert gases do not. This quality makes the getter device ideal for ring laser gyroscope applications because a ring laser gyroscope usually employs inert gases for lasing. This holds true for other gas discharge applications, such as neon signs.

A ring laser gyroscope detects and measures angular rates by measuring the frequency difference between two counter-rotating laser beams according to the Sagnac effect. The two laser beams simultaneously circulate in the optical cavity of the gyroscope with the aid of mirrors to reflect each beam around the cavity. The laser beams will ideally have identical frequencies when the sensor is at rest. However, if the sensor is rotated, the beams will have different frequencies. This frequency difference is measured to provide the rate of rotation.

The optical cavity is filled with a gas that is excited by an electric current passing between the electrodes mounted on the block of the gyroscope. In a typical arrangement, a ring laser gyroscope has two anodes and one cathode mounted on the gyroscope block, but other applications employ different numbers of anodes and cathodes. When the electric potential becomes sufficiently large to create a population inversion within the lasing gas, a laser is generated. A typical lasing gas is a mixture of helium and neon, though other gases such as argon may be used.

The block of a ring laser gyroscope may contain at least one getter to maintain the purity of the lasing gas. The getter material absorbs non-inert gases both when the ring laser gyroscope is operational and when it is dormant. If the non-inert gases are not removed from the optical cavity, the lasing gas may degrade, which may reduce the efficiency of the laser. The degradation of the lasing gas may also impact the operational lifetime of the ring laser gyroscope.

The getter may consume oxygen during the lifetime of the gyroscope because oxygen is a non-inert gas. This consumption may cause a loss of oxygen in other components of the gyroscope that need oxygen to operate effectively. This may result in changed optical and electrical properties, which may also degrade the performance of the laser. If oxygen can be preserved in the system without affecting the purity of the lasing gas, the overall life of the gyroscope may be extended.

It would be desirable to restrict the rate at which a getter consumes impurities, while maintaining the purity of the lasing gas mixture.

SUMMARY

A getter is located in a getter well. The getter well is any enclosure in which a getter resides. The getter substantially removes non-inert gases from lasing gas. By limiting access to the getter well, gas flow to the getter is restricted. In one embodiment, the getter well contains a hole that limits gas flow between an optical cavity and the getter well. The hole dimensions restrict access to the getter. In another embodiment, placing a disk or other obstruction between the getter well and the optical cavity may restrict access to the getter. In another embodiment, a diffusion barrier is formed on getter material, which reduces a rate at which the getter removes non-inert gases.

BRIEF DESCRIPTION OF THE DRAWINGS

Preferred embodiments are described below in conjunction with the appended drawing figures, wherein like reference numerals refer to like elements in the various figures, and wherein.

DETAILED DESCRIPTION

Figure 1:
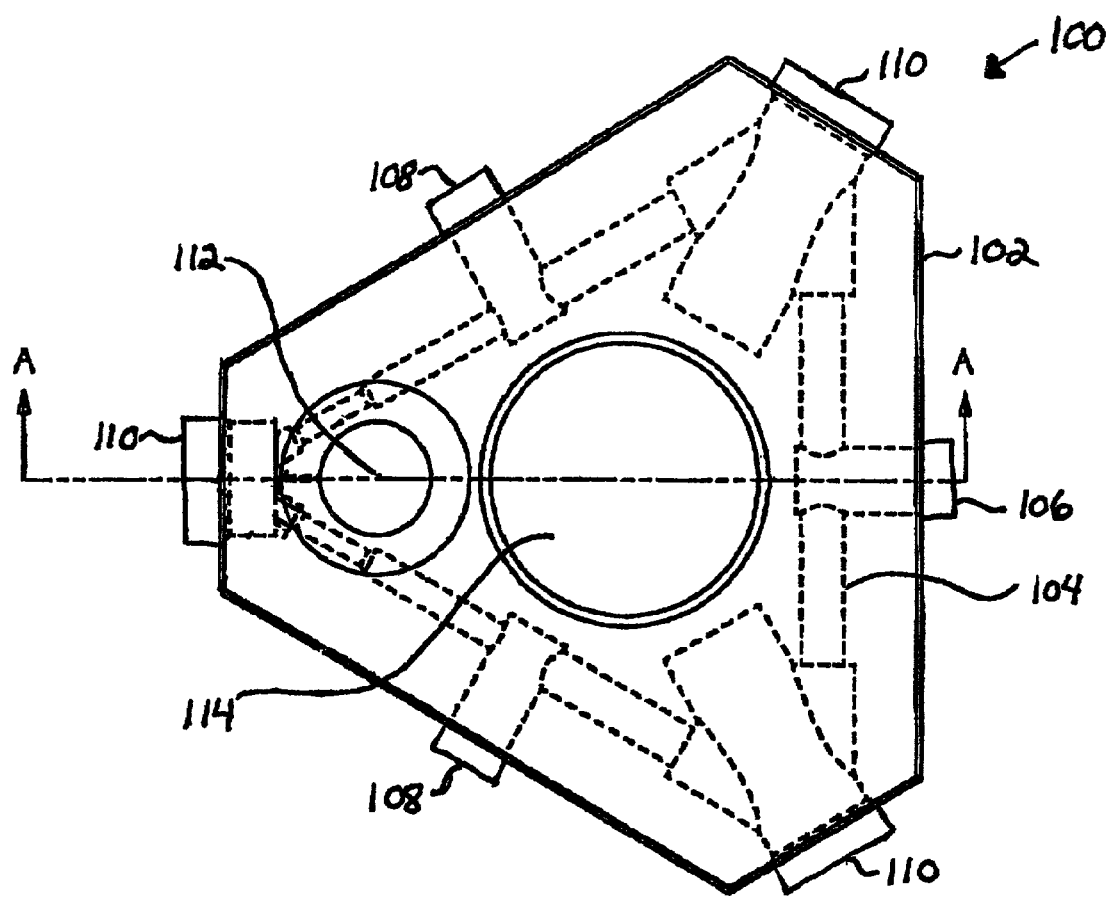
FIG. 1 is a top view of a ring laser gyroscope system according to an exemplary embodiment.

FIG. 1 shows a top view of an exemplary embodiment of a ring laser gyroscope system 100. The ring laser gyroscope system 100 consists of a gyroscope block 102, an optical cavity 104, at least one cathode 106, at least one anode 108, at least one mirror 110, a getter well 112, and a mounting structure 114.

The getter well 112 may be located within the gyroscope block 102, adjacent to the optical cavity 104. The getter well 112 may be any enclosure in which a getter resides. The getter well 112 may be drilled through the top of the gyroscope block 102, with the drilling terminating prior to reaching the bottom of the gyroscope block 102. The getter well 112 may be drilled into the gyroscope block 102 such that the getter well is not in contact with the optical cavity 104. Alternatively, the getter well 112 may be located in a gas discharge device with access to a gas discharge cavity.

Figure 2:
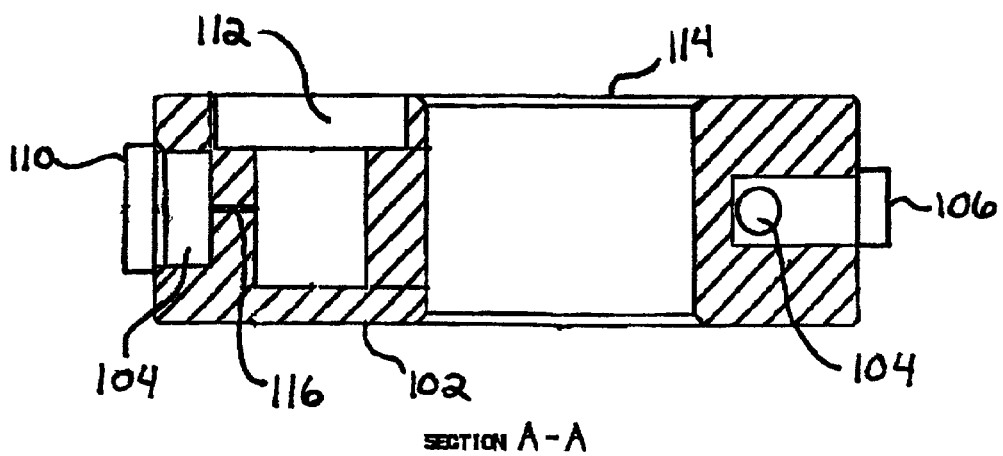
FIG. 2 is a sectional view of a ring laser gyroscope system taken along a line A—A shown in FIG. 1 according to an exemplary embodiment.

FIG. 2 illustrates a sectional view of the ring laser gyroscope system 100 taken along a line A—A shown in FIG. 1 according to an exemplary embodiment. A hole 116 may be drilled between the getter well 112 and the optical cavity 104 through the gyroscope block 102. The hole 116 may allow gases in the optical cavity 104 to flow into the getter well 112. The dimensions of the hole 116 in an exemplary embodiment may be substantially 0.020 inches in diameter and 0.170 inches long; however, other hole dimensions may be employed. The hole dimensions may limit the rate at which gases flow between the getter well 112 and the optical cavity 104.

Figure 3:
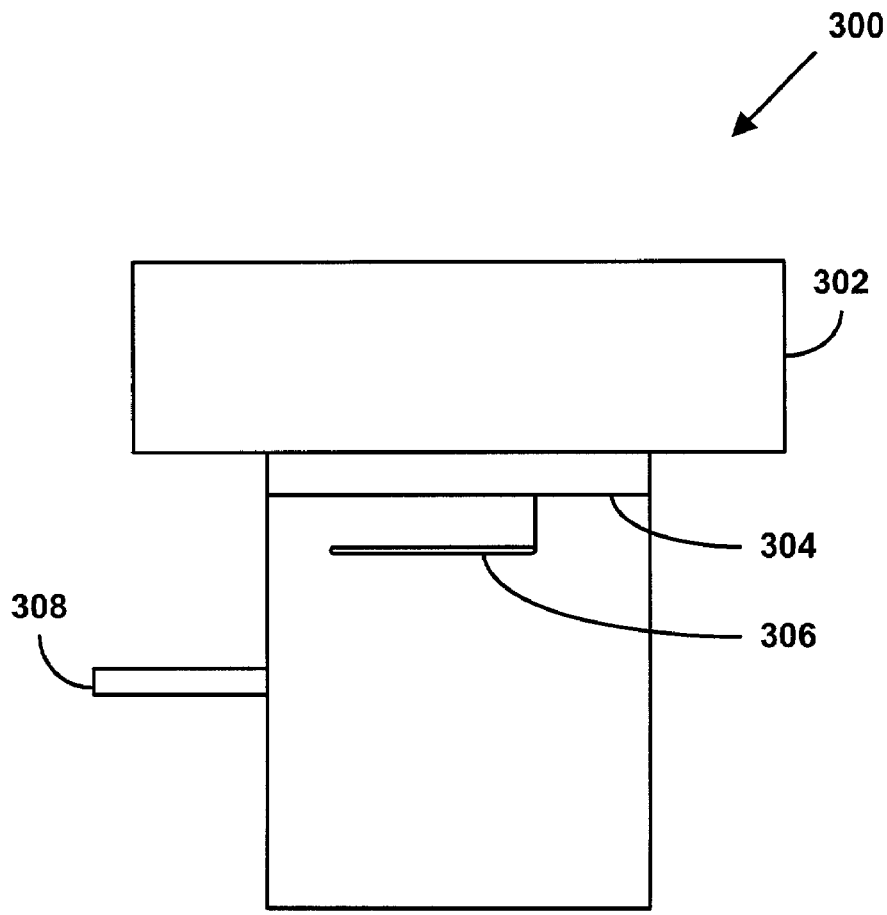
FIG. 3 is a side view of a getter well system according to an exemplary embodiment.

FIG. 3 shows a side view of an exemplary embodiment of a getter well system 300. The getter well system 300 consists of a getter well 302, a snap ring 304, and a getter 306. The getter well 302 is substantially the same as the getter well 112 of the ring laser gyroscope system 100.

Getter well 302 may contain a hole 308, substantially similar to the hole 116 of ring laser gyroscope system 100. The getter well 302 may also contain the snap ring 304. The snap ring 304 may hold the getter 306 in place within the getter well 302. Alternative getter holding mechanisms, such as a spring, may also be used.

The getter 306 is preferably composed of a barium alloy getter material. Other getter materials, such as titanium or zirconium alloys, may also be used. The getter material may be porous and, as such, gases readily diffuse through the pores of the material. Inert gases may pass through the material, while non-inert gases, such as oxygen, may absorb to the inner parts of the getter 306. The lasing gas employed in a ring laser gyroscope system 100 (see FIG. 1) may be a single inert gas or a combination of inert gases. The getter 306 is employed to remove impurities (non-inert gases) from the lasing gas. The getter 306 may be formed into a ring, but other shapes may be employed.

The ring laser gyroscope system 100 has both a dormancy period and an operational period. During the dormancy period slow leaks of non-inert gas may enter the gyroscope block 102. The hole 308 may limit the rate at which gases flow between the getter well 302 and the optical cavity 104; however, the getter 306 may continue to absorb substantially all of the impurities that enter the gyroscope block 102. By limiting the flow rate, the getter 306 capacity may not be reduced. However, the amount of time the getter 306 takes to absorb the impurities may be increased.

During the operation of the ring laser gyroscope system 100, the at least one cathode 106 may also act as a purifier of the lasing gas. The combination of the at least one cathode 106 and the getter 306 substantially removes the impurities from the lasing gas during ring laser gyroscope system 100 operation. Therefore, both during the dormancy period and the operational period of the ring laser gyroscope system 100, the purity of the lasing gas may be maintained in an exemplary embodiment.

Restricting the getter 306 may increase the lifetime of the ring laser gyroscope system 100 by a factor of two or three, according to an exemplary embodiment. For example, a ring laser gyroscope system designed for an operational lifetime of fifteen years may have its lifetime expectancy increased to thirty years. This increase in operational lifetime may be attributed to the increased amount of oxygen available to components within the ring laser gyroscope system.

Oxygen is a non-inert gas, and as such it may absorb to the getter 306. However, some components within the ring laser gyroscope system 100, such as the at least one cathode 106, need oxygen to operate effectively. For example, when the oxygen is depleted in the gyroscope block 102, a beryllium oxide layer on the at least one cathode 106 may thin and sputter. This may cause the ring laser gyroscope system 100 to consume neon (or other lasing gas) at a higher rate, and may eventually cause the ring laser gyroscope system 100 to fail.

Other components of the ring laser gyroscope system 100 may also benefit from restricting the getter 306. For example, certain types of mirrors may also need oxygen for their ability to operate in a ring laser gyroscope system 100.

Figure 4:
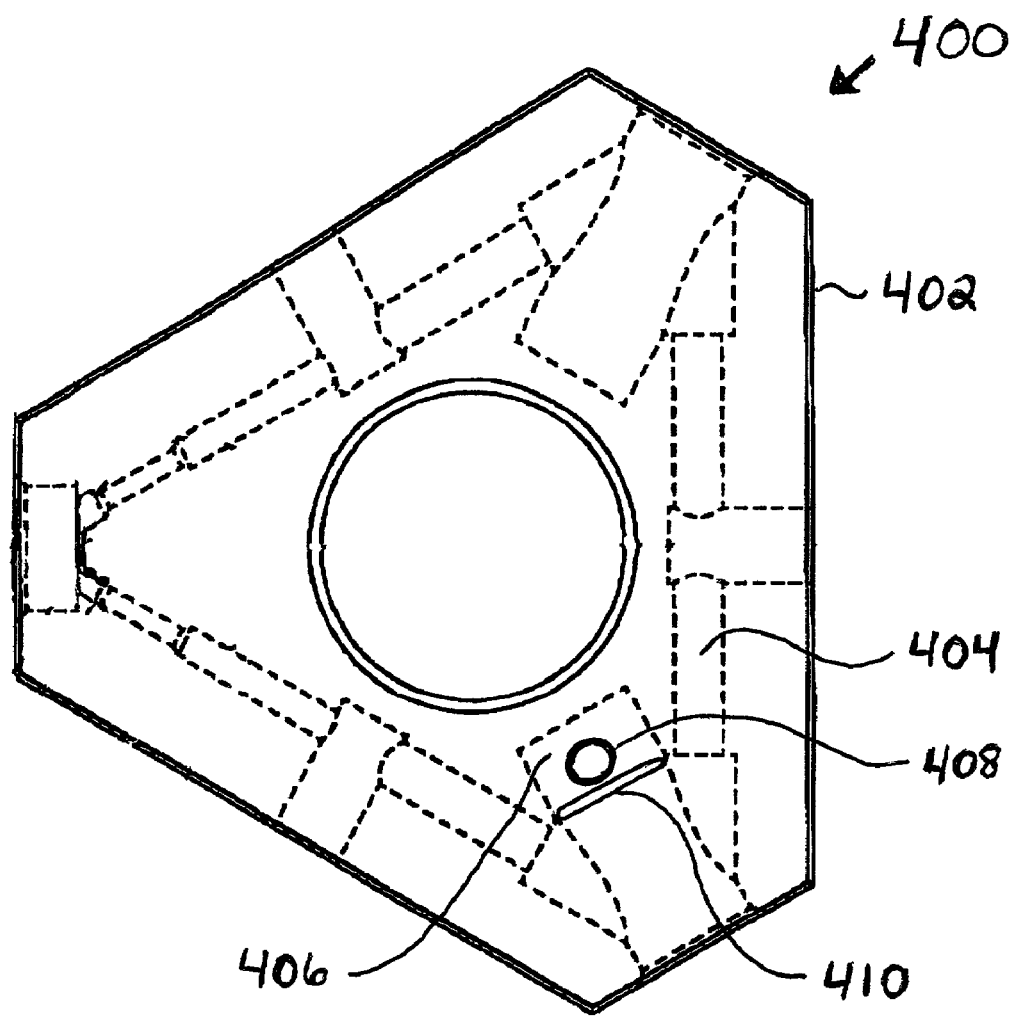
FIG. 4 is a top view of a ring laser gyroscope system according to an exemplary embodiment.

FIG. 4 shows an exemplary embodiment of a ring laser gyroscope system 400.

Ring laser gyroscope system 400 includes a gyroscope block 402, an optical cavity 404, a getter well 406, a getter 408, and a disk 410. Ring laser gyroscope system 400 is similar to ring laser gyroscope system 100; however, the getter well 406 is located within the optical cavity 404. This embodiment may eliminate the need to drill a getter well through the top of a gyroscope block 402. Alternatively, the getter well 406 may be located in a gas discharge cavity.

The disk 410 may be placed in the optical cavity 404 to substantially separate the getter well 406 from the rest of the optical cavity 404. The disk 410 may be composed of a permeable glass material, which may allow gases to pass through the disk 410 and into the getter well 406. However, the flow rate of the gases flowing into and out of the getter well 406 may be limited. The disk 410 may be circular; however, the disk 410 is not limited to that shape. The disk 410 may be of any shape that would substantially cover the getter well 406, such as a square.

The disk 410 may be constructed from the same type of glass material that is used to form the gyroscope block 402. In an exemplary embodiment, Zerodur is the material used for both the disk 410 and the gyroscope block 402. Zerodur is a glass ceramic material with an extremely low coefficient of thermal expansion. Other materials that are gas permeable may also be suitable. By selecting the same material for both the disk 410 and the gyroscope block 402, these components may have the same temperature coefficients, which may reduce thermal expansion and contraction problems.

The disk 410 may be held in place with a seal. The seal in an exemplary embodiment is constructed of indium. Indium is frequently chosen as a seal material because of its unique properties of adhering to both ceramics and metals, and of not losing its vacuum seal in the presence of thermal expansion. Other materials, such as tin, lead, or alloys made with indium, tin or lead, may also be used to construct the seal. Other methods of holding the disk 410 in place may be used. For example, a snap ring may be employed to hold the disk 410 in place.

In another exemplary embodiment, the operational time of the getter 408 may be restricted. By closing the getter well 406 during the operational period of the ring laser gyroscope system 400, the getter 408 may be isolated from the optical cavity 404 during that period. The getter 408 may be limited to removing impurities from the lasing gas during the dormant period of the ring laser gyroscope system 400.

Closing the getter well 406 during the operation of the ring laser gyroscope system 400 may be accomplished with either microelectromechanical system (MEMS) valves, or with an offset hole with a revolving disk. When the ring laser gyroscope system 400 is in operation, a force may be applied to close the valve or the disk, which may isolate the getter well 406 from the optical cavity 404. Other methods of closing the getter well 406 during the operational period of the ring laser gyroscope system 400 may also be employed. When the ring laser gyroscope system 400 is dormant, the valve or the offset hole may be opened to allow gases in the optical cavity 404 to enter the getter well 406. In addition, access to the getter well 406 may be controlled to allow intermediate access to the getter well 406.

In another exemplary embodiment, the getter 408 may be restricted using a combination of restricting the amount of gas that enters a getter well 406 and restricting the operational time of the getter 408.

Figure 5:
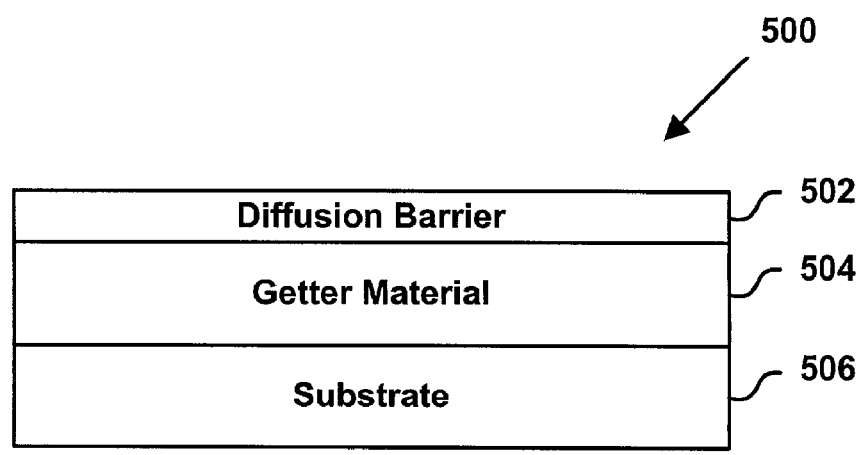
FIG. 5 is a side view of a diffusion barrier system according to an exemplary embodiment.

FIG. 5 shows a side view of barrier system 500. In an exemplary embodiment, the getter may be restricted by forming a diffusion barrier 502 over the getter material 504. The getter material 504 may be located on a substrate 506. Diffusion barrier 502 may be formed by chemical reaction between the getter material 504 and a gas. For example, if the getter material 504 is composed of barium, nitrogen can be employed to form a diffusion barrier 502 of barium nitride. The diffusion barrier 502 may reduce the rate in which the getter absorbs non-inert gases without reducing the capacity of the getter. The use of the diffusion barrier 502 may be used in conjunction with the hole 116 of ring laser gyroscope system 100 (see FIG. 1) or the disk 410 of ring laser gyroscope system 400 (see FIG. 4). However, diffusion barrier 502 may also be employed in applications in which the getter well may not be restricted.

Variations to the exemplary embodiments may be made without departing from the intended scope of the invention. It is within the scope of this invention to employ these methods in other getter applications in addition to what was demonstrated here using a ring laser gyroscope. For example, these methods may be applicable for use in any gas discharge device. The claims should not be read as limited to the described order or elements unless stated to that effect. Therefore, all embodiments that come within the scope and spirit of the following claims and equivalents thereto are claimed as the invention.

We claim:

1. A system for restricting a getter, comprising in combination:
    a getter located in a getter well, wherein the getter well is located in a gyroscope block having an optical cavity, wherein the optical cavity is located in the gyroscope block forming a closed loop path along an outer edge of the gyroscope block, and wherein the getter well is located at a distance away from the optical cavity and within the closed loop path brined by the optical cavity; and
    a hole located in the gyroscope block between the getter well and the optical cavity, wherein the hole has a diameter substantially less than a diameter of the getter well thereby limiting gas flow between the getter well and the optical cavity.

2. The system of claim 1, wherein the getter is composed of a barium alloy.

3. The system of claim 1, wherein the getter removes non-inert gases from the optical cavity.

4. The system of claim 1, wherein a snap ring holds the getter in the getter well.

5. The system of claim 1, wherein the hole is substantially 0.020 inches in diameter and 0.170 inches long.

6. A system for restricting a getter, comprising in combination:
    a getter composed of a barium alloy located in a getter well, wherein the getter well is located in a gyroscope block, wherein the getter well is located at a distance away from an optical cavity located in the gyroscope block, wherein the getter removes nan-inert gases from the optical cavity, wherein a snap ring holds the getter in the getter well; and
    a hale located between the getter well and the optical cavity, wherein the hole has a diameter substantially less than a diameter of the getter well, wherein the hole is substantially 0.020 inches in diameter and 0.170 inches long, wherein the hole limits gas flow between the getter well and the optical cavity.

7. A method for restricting a getter comprising in combination:
    drilling a getter well through a top of a gyroscope block having an optical cavity, wherein the optical cavity is located in the gyroscope block forming a closed loop path along an outer edge of the gyroscope block, and wherein the getter well is drilled at a distance away from the optical cavity and within the closed loop path formed by the optical cavity;
    inserting a getter into the getter well; and
    drilling a hole having a diameter substantially less than a diameter of the getter well between the getter well and the optical cavity, wherein the hole limits gas flow between the getter well and the optical cavity.

8. The method of claim 7, wherein the hole is substantially 0.020 inches in diameter and 0.170 inches long.

* * * * *

UNITED STATES PATENT AND TRADEMARK OFFICE
CERTIFICATE OF CORRECTION

| | | |
|---|---|---|
| PATENT NO. | : 6,992,442 B2 | Page 1 of 1 |
| APPLICATION NO. | : 10/014993 | |
| DATED | : January 31, 2006 | |
| INVENTOR(S) | : Touchberry et al. | |

It is certified that error appears in the above-identified patent and that said Letters Patent is hereby corrected as shown below:

Column 5, line 23, please delete "brined", replace with -- formed --.

Column 6, line 9, please delete "nan-inert", replace with -- non-inert --.

Column 6, line 12, please delete "hale", replace with -- hole --.

Signed and Sealed this

Nineteenth Day of June, 2007

JON W. DUDAS
*Director of the United States Patent and Trademark Office*